United States Patent
Layadi et al.

(10) Patent No.: US 6,585,830 B2
(45) Date of Patent: Jul. 1, 2003

(54) METHOD FOR CLEANING TUNGSTEN FROM DEPOSITION WALL CHAMBERS

(75) Inventors: Nace Layadi, Singapore (SG); Sailesh Mansinh Merchant, Orlando, FL (US); Simon John Molloy, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/727,326

(22) Filed: Nov. 30, 2000

(65) Prior Publication Data

US 2002/0062846 A1 May 30, 2002

(51) Int. Cl.[7] .................................................. B08B 5/00
(52) U.S. Cl. ........................... 134/21; 134/2; 134/22.1; 134/22.17; 134/26; 134/30; 134/36; 134/42
(58) Field of Search ............................ 134/2, 21, 22.1, 134/22.17, 26, 30, 36, 42

(56) References Cited

U.S. PATENT DOCUMENTS

| | | | | |
|---|---|---|---|---|
| 4,786,352 A | * | 11/1988 | Benzing | 156/345 |
| 4,997,520 A | * | 3/1991 | Jucha et al. | 156/643 |
| 5,207,836 A | * | 5/1993 | Chang | 134/1 |
| 5,679,215 A | * | 10/1997 | Barnes et al. | 156/646.1 |
| 5,714,011 A | * | 2/1998 | Schneider et al. | 134/21 |
| 5,849,092 A | * | 12/1998 | Xi et al. | 134/1.1 |
| 5,861,065 A | * | 1/1999 | Johnson | 134/22.1 |
| 5,879,575 A | * | 3/1999 | Tepman et al. | 118/723 I |
| 6,014,979 A | * | 1/2000 | Van Autryve et al. | 134/1.1 |
| 6,047,713 A | * | 4/2000 | Robles et al. | 134/1.1 |
| 6,136,211 A | * | 10/2000 | Qian et al. | 216/37 |
| 6,176,936 B1 | * | 1/2001 | Taguwa | 134/2 |
| 6,274,500 B1 | * | 8/2001 | Xuechun et al. | 438/706 |
| 6,305,390 B1 | * | 10/2001 | Jeon | 134/1.1 |

* cited by examiner

*Primary Examiner*—Sharidan Carrillo
(74) *Attorney, Agent, or Firm*—Ferdinand M. Romano

(57) ABSTRACT

An unwanted tungsten film deposit on a Chemical Vapor Deposition chamber is cleaned by adding a mixture of at least two cleaning gases into the chamber at a predetermined temperature and pressure and in contact with said chamber walls for a sufficient length of time. The cleaning gases and reacted tungsten species are removed from the chamber by vacuum, and unreacted cleaning gases are removed by purging the chamber with an inert gas. At least one cleaning gas is selected from the group consisting of bromomethane, dibromomethane, bromoform and mixtures thereof. The temperature of the chamber is preferably at least about 300 degrees Celsius. The cleaning gases in the chamber are at a pressure in the range from about 100 to 200 Torr and the chamber is purged at a pressure in the range from about 200 to 500 Torr.

16 Claims, No Drawings

METHOD FOR CLEANING TUNGSTEN FROM DEPOSITION WALL CHAMBERS

BACKGROUND OF THE INVENTION

1. Field of the Invention

The invention relates to a method for rapid cleaning of tungsten which coats Chemical Vapor Deposition chambers. In particular, the method uses gas phase chemistry and a single gas or a combination of hydrogen bromide, bromomethane, dibromomethane or bromoform to clean tungsten off the reactor surface. The method uses the chamber's existing ports and vacuum system, is fast and easy and eliminates the need for an expensive plasma excitation system and plasma cleaning.

2. Description of the Prior Art

Chemical vapor deposition (hereinafter CVD) methods are used broadly in the manufacture of semiconductor wafers. CVD involves exposing a semiconductor wafer to a reactive gas under carefully controlled conditions of elevated temperatures, sub-ambient pressures, and uniform reactant gas flow rate so that a thin, uniform layer of film is deposited on the surface of the substrate. Several types of CVD processes are known, such as, for example, atmospheric CVD, low-pressure CVD, reduced-pressure CVD and plasma enhanced CVD.

A commonly used CVD system is a single-wafer CVD system utilizing a high-throughput CVD chamber. This is a result of the more stringent standards of film quality and increasing wafer sizes utilized in recent years.

For processing, typically, a CVD chamber is first heated in a range of 300 to 1,000 degree Celsius. A semiconductor substrate is mounted on a holding piece, called a susceptor, which is typically made of anodized aluminum. Then, processing gases are flowed into the chamber while the chamber pressure is regulated to an optimum level for achieving a uniform layer of film. The gases react to form a deposition layer on the surface of the wafer.

In a conventional deposition process, reactant gases enter the reaction chamber and produce films of various materials on the surface of a substrate for various purposes such as for dielectric layers, for insulation layers, etc. The various electronic materials deposited include refractory metals such as titanium, tungsten and their suicides. These refractory metals and their silicides have found widespread use in the manufacture of very large-scale integrated circuits. Tungsten (W), in particular, because of its chemical stability and its ease of film formation by CVD, is used extensively for the formation of electrical contacts to silicon device elements. Tungsten silicide ($WSi_2$) is frequently selectively formed over exposed silicon surfaces by depositing a tungsten layer, annealing to react the layer with the silicon areas and etching away the unreacted tungsten, leaving tungsten silicide only on the silicon.

In these film deposition processes, most of the material from the reactant gases is deposited on the substrate surface. However, it is inevitable that material is also deposited on other surfaces inside the chamber. During the deposition process, flakes of tungsten from these surfaces can fall onto the wafer and cause a high density of defects. In order to maintain a consistent process and reduce defects, the walls of the chamber are cleaned between several lots or as part of a periodic maintenance schedule. Often, the cleaning is done after every twenty-five wafers in order to maintain high efficiency and reduce defects. This cleaning process typically uses plasma cleaning, often-containing hexafluoroethane, argon and oxygen. This method requires an expensive plasma excitation system where electrodes are connected to a RF power generator and the gas mixture is excited to plasma. The plasma is then used to bombard the chamber walls to remove the tungsten coating. Some variability in the cleaning capability of this system exists as its efficiency is relative to the pressure applied in the chamber. Methods using plasma cleaning are described in U.S. Pat. No. 5,902,403 issued to Aitani and U.S. Pat. No. 6,047,713 to Robles.

Alternatively, a wet clean method can be employed where the chamber is opened, taken apart, cleaned by wiping the chamber walls down and then baked at high temperature. The reassembled chamber is then pumped down to a high vacuum to remove any cleaning solvent. This is a very laborious and time consuming process which leads to poor throughput and increased cost of manufacturing. Furthermore, after each manual cleaning process, the entire exhaust flow control system must be recalibrated in order to resume production.

Methods using non-plasma gases such as that disclosed by Xi in U.S. Pat. No. 5,926,743 make use of an etchant gas (chlorine tri-fluoride) diluted with an inert gas or carrier to remove particles and buildup from chamber walls. Etchant gases require careful temperature and pressure controls to prevent damage to the substrate or the chamber.

SUMMARY OF THE INVENTION

It has now been found that a fast and effective in-situ method for cleaning tungsten deposited on the chamber walls of CVD chambers after use can be provided. In particular, the method eliminates formation of plasma with any excitation frequency, including microwave, from the cleaning process and, instead, uses a combination of appropriate gases that reduces the cost associated with the process.

The present invention provides an improved method for cleaning tungsten deposited onto the walls of CVD deposition chambers, without necessitating modifications to the deposition chamber. Additionally, the ratio of gases can be adjusted continuously in order to maximize formation and removal of tungsten bromide species. Further the process does not require disassembly of the chamber prior to cleaning so loss of production time is minimized.

Cleaning of the CVD chamber is generally done after the silicon wafers have been removed to avoid removing desired depositions from the wafer itself. Prior to cleaning, an inert gas such as nitrogen or argon can be used to purge the chamber of any interfering species that may reduce the efficient removal of tungsten from the chamber walls. After clearance of any purge gas, hydrogen bromide or dibromomethane is then pumped into the chamber alone or in combination with one or more of the bromomethanes including bromoform, dibromomethane or bromomethane. Unlike plasma cleaning, carrier gases are not required in the use of these compounds.

It has been found that either hydrogen bromide or dibromomethane alone can remove the tungsten from the chamber walls. In a preferred embodiment, a combination of bromoform is added to the HBr and the combination reacts with the tungsten on the chamber walls to form various tungsten-bromium species, including $WBr_2$, $WBr_4$ and $WBr_5$ that are then pumped away using the chamber's vacuum system. The HBr in combination with the other gases has been found to substantially increase the efficiency of the cleaning operation and to reduce the amount of time required for the cleaning step. In another embodiment, a combination of the three methano-bromium species is used with hydrogen bromide to modify removal of tungsten. In a third embodiment, bromoform or a combination of two or all three of the bromomethanes is pumped into the CVD chamber over a range of ratios to clean various tungsten-bromium species. After cleaning, an inert gas such as nitrogen is used to purge the chamber completely of reactive bromine in order to prevent interference of deposition during production of substrate.

DESCRIPTION OF THE PREFERRED EMBODIMENTS OF THE INVENTION

The present invention provides an improved method of in situ cleaning of tungsten from the chamber walls of a chemical vapor deposition chamber during the regular cleaning cycle for the chamber interior after the deposition process.

Cleaning gases, hydrogen bromide alone, or mixed with one or more species of bromomethane ($CH_3Br$), dibromomethane ($CH_2Br_2$), or bromoform ($CHBr_3$), is pumped into the chamber such that the chamber pressure can be maintained at less than 200 Torr. The ratio of gases is variable to the species of methyl bromide selected but is in the range of $HBr/CH_3Br$—1:1, $HBr/CH_2Br_2$—2:1 to $HBr/CHBr_3$—3:1. The ratio of gases can be adjusted during the cleaning process to achieve optimal removal of tungsten from the chamber walls. The temperature inside the vacuum chamber during such cleaning process is in the range between 300 to 500 degrees Celsius and can also be adjusted during the cleaning process. The bromine in the gas mixture reacts with the tungsten deposit layers on the inside surface of the chamber to form various species of tungsten bromide, including tungsten dibromide ($WBr_2$), tungsten (IV) bromide ($WBr_4$) and tungsten (V) bromide ($WBr_5$). The time required for the cleaning process depends on the thickness of the deposit and is preferably less than or equal to 10 minutes but may range up to about 25 minutes.

In one embodiment, a purge using an inert gas such as nitrogen or argon is completed prior to cleaning to remove any reactive gases that may remain in the chamber. The chamber is heated to a temperature of at least about 300 degrees Celsius. Preferably, the chamber is heated in the range from 300 to 500 degrees Celsius and internal pressure in a range from 100 to 200 Torr is applied. Bromoform is mixed with the hydrogen bromide in a fixed ratio and is added to the chamber for ten minutes. The resulting tungsten-bromium species are pumped out of the chamber using the vacuum system contained in the CVD tool and a final purge using an inert gas such as nitrogen or argon is completed to remove any unreacted bromine.

In another embodiment, the chamber is heated in the range from 300 to 500 degrees Celsius and an internal pressure of 100 to 200 Torr is applied. Bromoform is mixed with the hydrogen bromide in and is added to the chamber for five minutes or less before being pumped out using the tool's vacuum. The ratio for $HBr/CH_3Br$ is 1:1, $HBr/CH_2Br_2$ is 2:1 and for $HBr/CHBr_3$ is 3:1. At the completion of this time period, a second mixture of bromoform and hydrogen bromide is added to the chamber in a ratio as before, for five minutes or less before being removed.

In yet another embodiment, this process is completed several times over using different ratios of the selected methyl bromide species and hydrogen bromide. In all embodiments, a final purge using an inert gas is necessary to complete the cleaning cycle. The chamber may be purged at a pressure in the range from about 200 to 500 Torr.

While the present invention has been described in an illustrative manner, it should be understood that the terminology used is intended to in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method of cleaning unwanted tungsten deposited onto walls of a chemical vapor deposition chamber comprising the steps of:
   providing at least one cleaning gas selected from the group consisting of hydrogen bromide, bromomethane, dibromomethane, and bromoform in said chamber;
   contacting said at least one cleaning gas with the chamber walls for a period of time under non-plasma conditions and at a predetermined temperature and pressure to react with said tungsten;
   removing said at least one cleaning gas and reacted tungsten from the chamber walls by vacuum; and
   removing unreacted said at least one cleaning gas by purging the chamber with an inert gas.

2. A method according to claim 1, wherein said chamber is purged with an inert gas prior to contacting said chamber walls with said at least one cleaning gas.

3. A method according to claim 1 or 2, wherein said temperature inside said chamber is at least about 300 degrees Celsius.

4. A method according to claim 1 or 2, wherein said at least one cleaning gas is at a pressure in the range from about 100 to 200 Torr.

5. A method according to claim 1 or 2, wherein said chamber is purged at a pressure in the range from about 200 to 500 Torr.

6. A method according to claim 1 or 2, wherein said period of time is up to about 25 minutes.

7. A method according to claim 1, wherein said at least one cleaning gas comprises hydrogen bromide and a gas selected from the group consisting of bromomethane, dibromomethane, bromoform and mixtures thereof.

8. A method according to claim 3, wherein said temperature inside said chamber is up to about 500 degrees Celsius.

9. A method according to claim 3 wherein said at least one cleaning gas is at a pressure in the range from about 100 to 200 Torr.

10. A method according to claim 7, wherein said temperature inside said chamber is at least about 300 degrees Celsius.

11. A method according to claim 9 wherein said chamber is purged at a pressure in the range from about 200 to 500 Torr.

12. A method according to claim 10, wherein said temperature inside said chamber is up to about 500 degrees Celsius.

13. A method according to claim 10 or 12, wherein said at least one cleaning gas is at a pressure in the range from about 100 to 200 Torr.

14. A method according to claim 11, wherein said period of time is up to about 25 minutes.

15. A method according to claim 13 wherein said chamber is purged at a pressure in the range from about 200 to 500 Torr.

16. A method according to claim 15, wherein said period of time is up to about 25 minutes.

* * * * *